United States Patent [19]
Kim

[11] Patent Number: 5,409,566
[45] Date of Patent: Apr. 25, 1995

[54] SLOPE ETCHING PROCESS

[75] Inventor: Jeong J. Kim, Seoul, Rep. of Korea

[73] Assignee: Goldstar Co., Ltd., Seoul, Rep. of Korea

[21] Appl. No.: 126,023

[22] Filed: Sep. 24, 1993

Related U.S. Application Data

[63] Continuation of Ser. No. 738,471, Jul. 31, 1991, abandoned.

[30] Foreign Application Priority Data

Jul. 31, 1990 [KR] Rep. of Korea ............... 11649/1990
Jul. 31, 1990 [KR] Rep. of Korea ............... 11650/1990

[51] Int. Cl.$^6$ ............................................. B05D 5/00
[52] U.S. Cl. .................................. 156/628; 156/651; 156/659.1; 156/643; 156/646
[58] Field of Search ................. 156/628, 659.1, 643, 156/646, 651, 655; 430/325, 326, 327; 427/307, 309

[56] References Cited

U.S. PATENT DOCUMENTS

| | | | |
|---|---|---|---|
| 3,833,434 | 9/1974 | Kikuchi et al. | 156/659.1 X |
| 4,075,367 | 2/1978 | Grulett | 427/307 X |
| 4,698,128 | 10/1987 | Berglund et al. | 156/659.1 X |
| 4,698,132 | 10/1987 | Dennis | 156/659.1 X |
| 4,814,041 | 3/1989 | Anda | 156/659.1 X |
| 4,935,334 | 6/1990 | Boettiger et al. | 430/327 X |
| 4,956,035 | 9/1990 | Sedlak | 156/659.1 X |
| 5,057,186 | 10/1991 | Chew et al. | 156/643 |

Primary Examiner—Thi Dang
Attorney, Agent, or Firm—Fish & Richardson

[57] ABSTRACT

A slope etching process including dipping a pattern forming layer into a predetermined dipping solution containing an etching solution or wet etching and de-ionized water, so as to utilize a wet etching method only for isotropic etching. There is also provided a slope etching process including forming a photoresist pattern layer having inclined edges and etching the photoresist pattern layer together with the pattern forming layer by using a gas mixture containing an etching gas for dry etching and $O_2$ gas, so as to utilize a RIE method only for anisotropic etching. According to the processes, it is possible to slope etch the pattern forming layer so as to form a pattern layer having a desired edge slope. Furthermore, the step coverage after process integration and productivity can be improved.

1 Claim, 7 Drawing Sheets

F I G. 5f
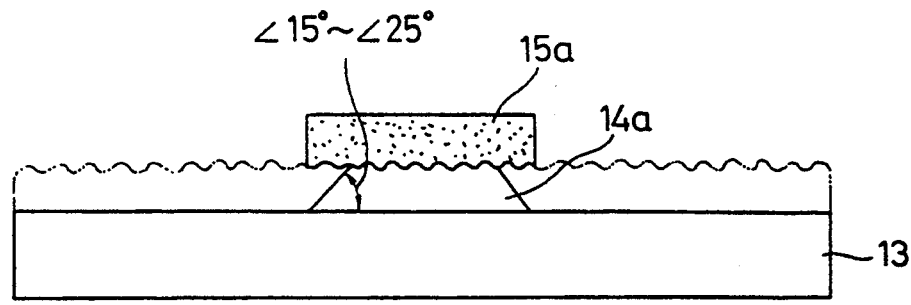
F I G. 5g
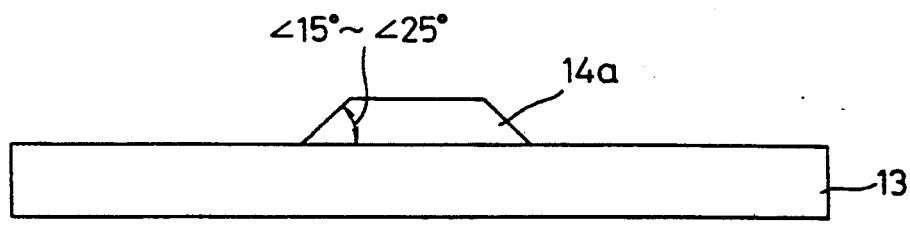
F I G. 6a
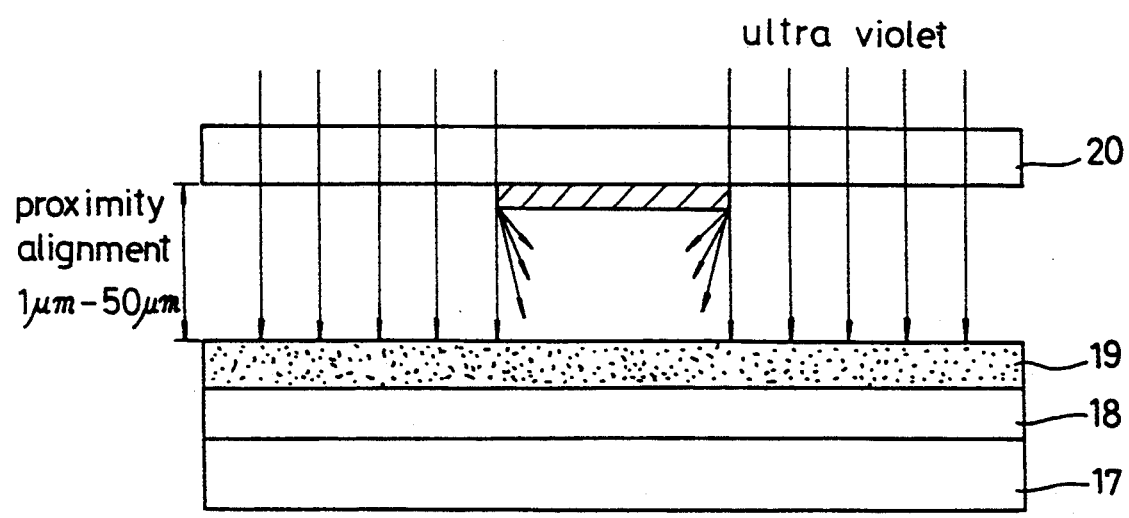

F I G. 6b
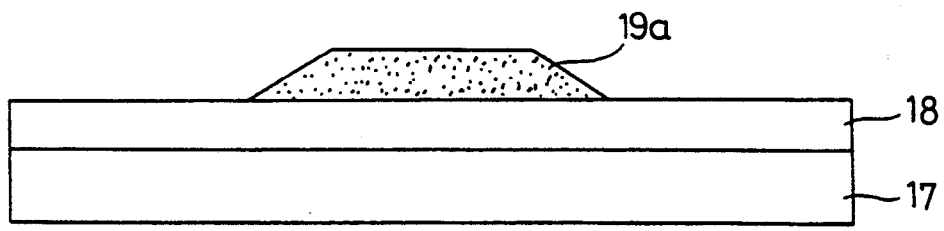
F I G. 6c
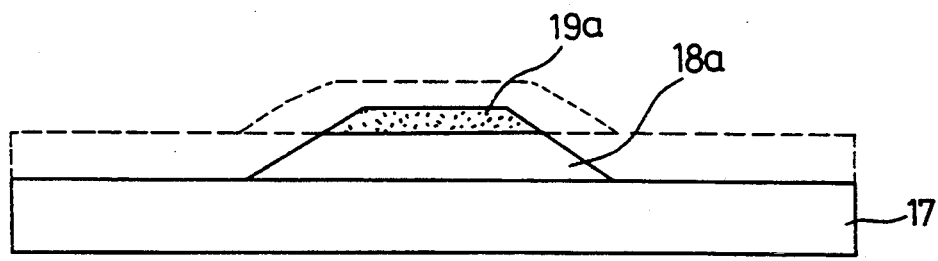
F I G. 6d
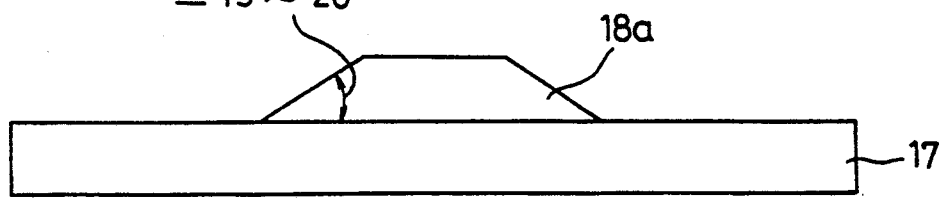

SLOPE ETCHING PROCESS

This application is a continuation application of the parent application Ser. No. 07/738,471, filed on Jul. 31, 1991 (now abandoned).

BACKGROUND OF THE INVENTION

1. Field of the Invention

The present invention relates to a slope etching process, and particularly to a slope etching process which provides a smooth slope for the pattern formed in manufacturing semi-conductor elements, thereby improving the step coverage.

2. Description of the Prior Art

In order to form a desired pattern in manufacturing semiconductor elements, photo processing and etching should be generally carried out. The etching is mainly classified into a dry etching process and a wet etching process, a suitable one of which is used depending on the existing conditions.

Recently, RIE (Reactive Ion Etching) method which is generally classified as the dry etching method is gradually being widely used in view of its convenience in processing over the wet etching method.

In forming a pattern, the conventional RIE method enables only anisotropic etching, so that the pattern of etched layer is formed such that its corner angle becomes about 90°.

The conventional pattern forming process utilizing the above-mentioned RIE method will now be described, in conjunction with FIGS. 1A to 1D.

First, a layer 2 for forming a predetermined pattern is deposited on a substrate 1, as shown in FIG. 1A. The layer 2 will be subsequently etched to form a pattern. On the layer 2, a photoresist 3 is coated and then radiated with ultra violet radiation under the condition that a photomask 4 is aligned on the photoresist 3 to be in contact therewith, in order to form a pattern layer 3a as shown in FIG. 1B. Thereafter, the layer 2 for forming a desired pattern is subjected to an etch utilizing the RIE method which is an anisotropic dry etch method. After the photoresist pattern layer 3a is removed from the etched pattern forming layer 2, a pattern layer 2a having corner angles of 90° is formed, as shown in FIG. 1D. However, the pattern forming utilizing the conventional RIE method has a disadvantage that when a primary upper deposition layer 5 is coated on the pattern layer 2a etched according to the RIE method, the step coverage, that is the coverage of the deposition layer 5 over steps (the "K" portion in FIG. 2) formed at respective corners of about 90° of the pattern layer 2a, becomes poor, after the process integration. Consequently, the pattern layer 2a formed by the RIE method and a second upper deposition layer 6 formed on the primary upper deposition layer 5 is subject to a short failure, thereby causing the productivity of semi-conductor elements to be reduced.

Also, the pattern forming process utilizing the conventional wet etching method will now be described, in conjunction with FIGS. 3A to 3D.

First, a pattern forming layer 8 to be etched is deposited on a substrate 7, as shown in FIG. 3A. On the layer 8, a photoresist 9 is coated. Then, the photoresist 9 is exposed to ultra violet radiation by using a photomask 10 printed with a predetermined pattern and developed to form a photoresist pattern layer 9a as shown in FIG. 3B. Thereafter, the wet etching is carried out as shown in FIG. 3C. At this time, the pattern forming layer 8 is isotropically etched. This is because the velocity $V_S$ of the etching which proceeds on the interface between the photoresist 10 and the pattern forming layer 8 and in parallel to said interface is substantially identical to the velocity $V_D$ of the etching which proceeds vertically to the surface of the element material ($V_S = V_D$). As a result, a pattern layer 8a is formed such that its lateral edges form an angle of 45° to the surface of substrate 7. As the photoresist pattern layer 9a is removed, a desired pattern layer 8a is formed, as shown in FIG. 3D. However, the pattern forming utilizing the conventional wet etching process also has a disadvantage that when a primary upper deposition layer 11 is coated on the pattern layer 8a etched according to the RIE method, its step coverage over respective 45° lateral edges of the pattern layer 8a becomes poor. Consequently, the pattern layer 8a and a second upper deposition layer 12 formed on the primary upper deposition layer 11 are subject to a short failure (at the portion "L" in FIG. 4). In particular, when the pattern layer 8a and the second upper deposition layer 12 form metal electrodes and the primary upper deposition layer forms an insulation layer, the pattern layer 8a and the second upper deposition layer 12 may be subject to a break down at the portion "L", thereby causing the productivity of semiconductor elements to be reduced.

SUMMARY OF THE INVENTION

Therefore, an object of the present invention is to overcome the above-mentioned disadvantages encountered in the prior art and to provide a slope etching process which includes the use of a certain dipping solution added to the conventional wet etching process enabling only the isotropic etch, so that a pattern forming layer obtained in photo processing and etching steps can be etched to have edges of a smooth slope angle.

Another object of the present invention is to provide a slope etching process which includes the addition of a certain gas to the etching gas used in the conventional RIE method, the dry etching method, so that a pattern forming layer obtained in photo processing and etching steps can be etched to have edges of a smooth slope angle.

In order to accomplish these objects, the present invention provides a slope etching process for wet etching a pattern forming layer to form a desired pattern layer, comprising the steps of: forming said pattern forming layer on a substrate; dipping the pattern forming layer into a dipping solution consisting of an etching solution and a deionized water which are mixed at a predetermined ratio so that the pattern forming layer has a porous surface; coating a photoresist on the dipped pattern forming layer; aligning a photomask over the photoresist; exposing said photomask and photoresist to ultra violet radiation and developing said photoresist to form a photoresist pattern layer; and wet etching the pattern forming layer by using the etching solution to obtain the desired pattern layer.

The present invention also provides a slope etching process for dry etching a pattern forming layer by using an RIE method to form a desired pattern layer, comprising the steps of: forming said pattern forming layer on a substrate; coating a photoresist on said pattern forming layer; disposing a photomask printed with a predetermined pattern at a position upwardly spaced apart from the surface of said photoresist; exposing said photomask to ultra violet radiation and developing the photoresist to form a photoresist pattern layer; and etching the pattern forming layer according to the RIE method and by using a gas mixture consisting of an etching gas and $O_2$ gas which are mixed at a predetermined rate.

BRIEF DESCRIPTION OF THE DRAWINGS

Numerous other features, objects and advantages of the invention will become apparent from the following specification when read in connection with the accompanying drawings in which:

FIGS. 5A to 5G are schematic sectional views illustrating a pattern layer forming process using a wet etching method according to the present invention; and FIGS. 6A to 6D are schematic sectional views illustrating a pattern layer forming process using a RIE method according to the present invention.

DETAILED DESCRIPTION OF THE PREFERRED EMBODIMENTS

Referring to FIGS. 5A to 5G, there is shown an embodiment of the present invention.

Figure 1A:
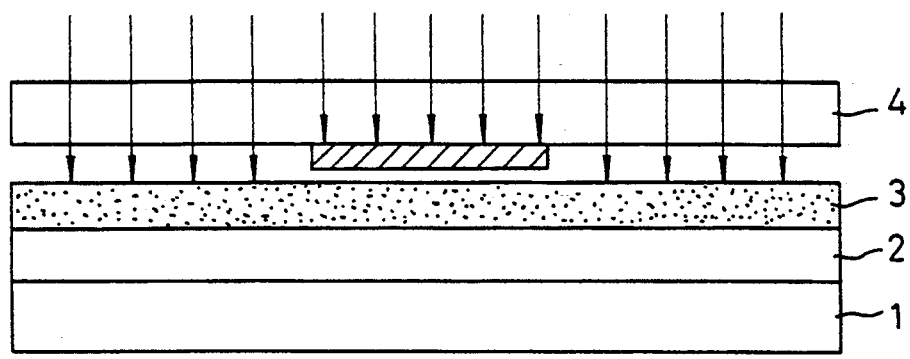
FIGS. 1A to 1D are schematic sectional views illustrating a pattern layer forming process using the conventional wet etching method.
Figure 1B:
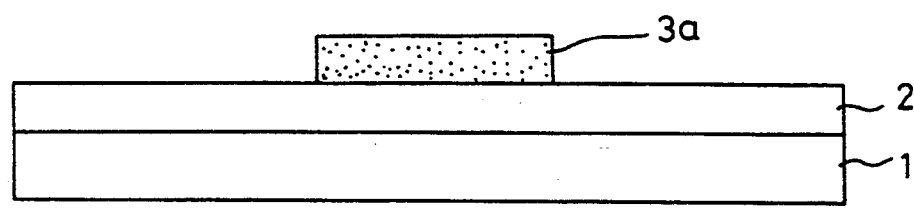
Figure 1C:
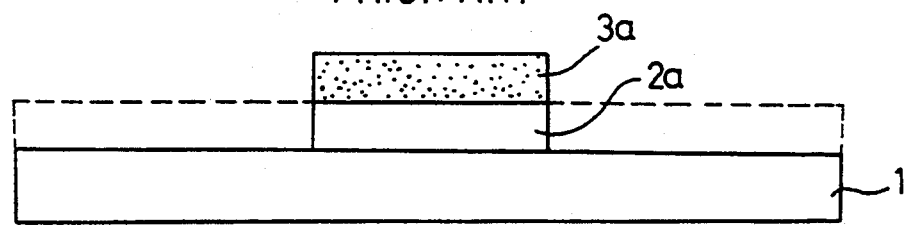
Figure 1D:
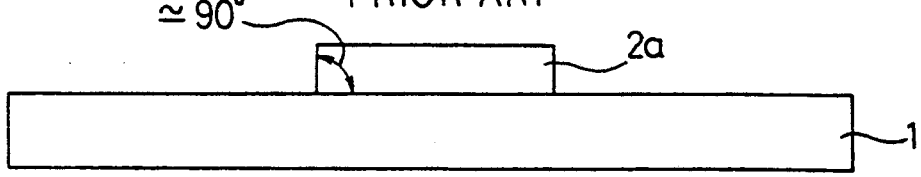
Figure 2:
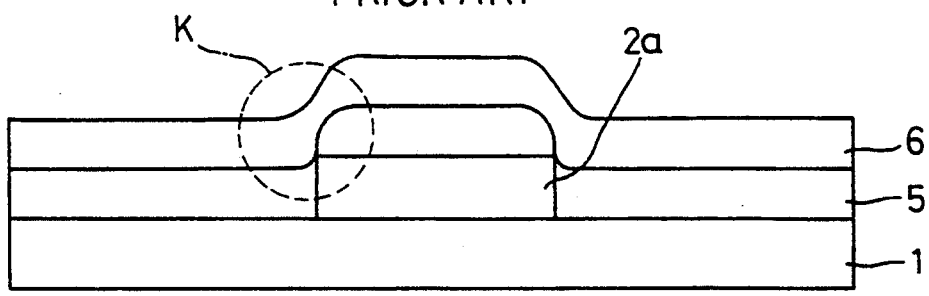
FIG. 2 is a schematic sectional view explaining a short failure condition occurring at the corners of a pattern layer formed by the conventional wet etching method.
Figure 3A:
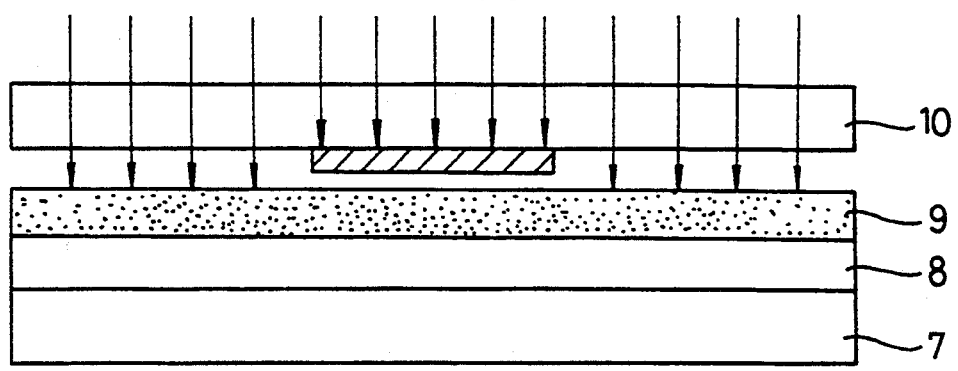
FIGS. 3A to 3D are schematic sectional views illustrating a pattern layer forming process using the conventional RIE method.
Figure 3B:
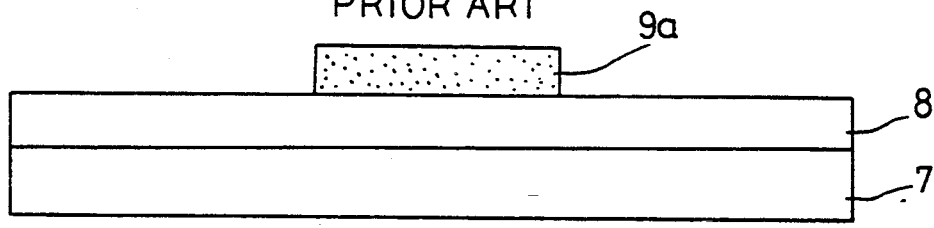
Figure 3C:
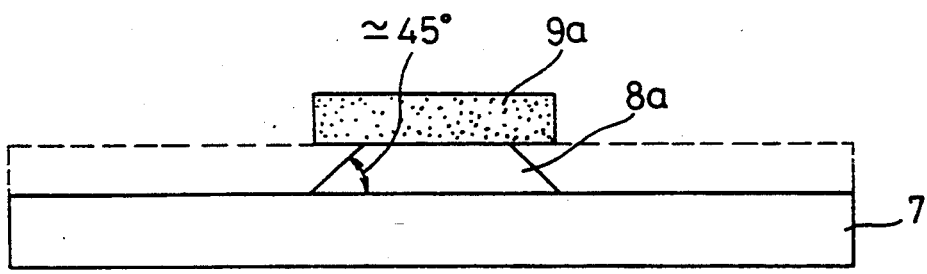
Figure 3D:
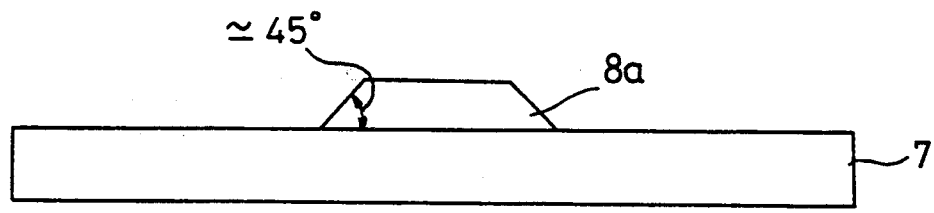
Figure 4:
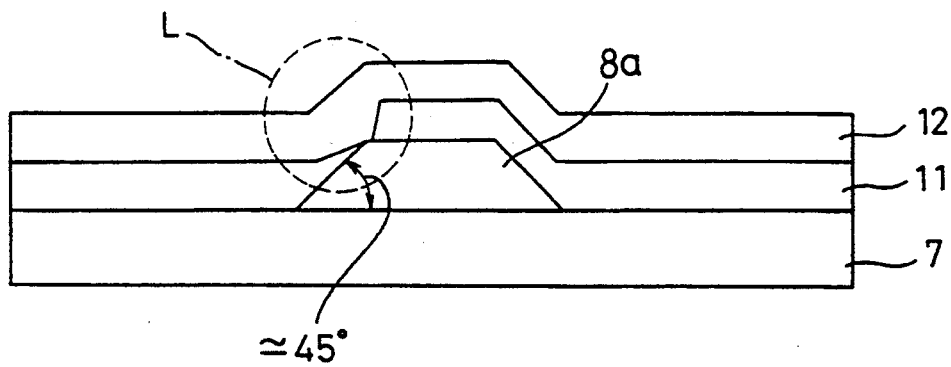
FIG. 4 is a schematic sectional view explaining a poor step coverage and a short failure condition occurring at the corners of a pattern layer formed by the conventional RIE method.
Figure 5A:
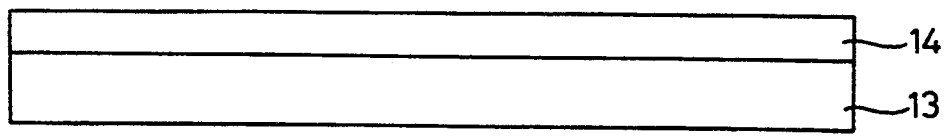
Figure 5B:
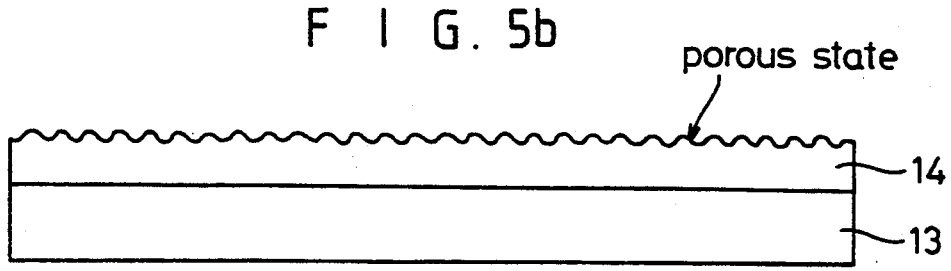
Figure 5C:
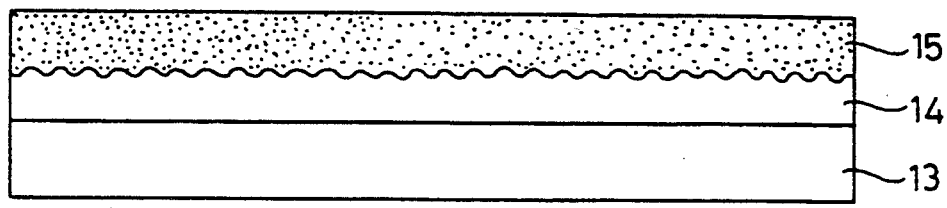
Figure 5D:
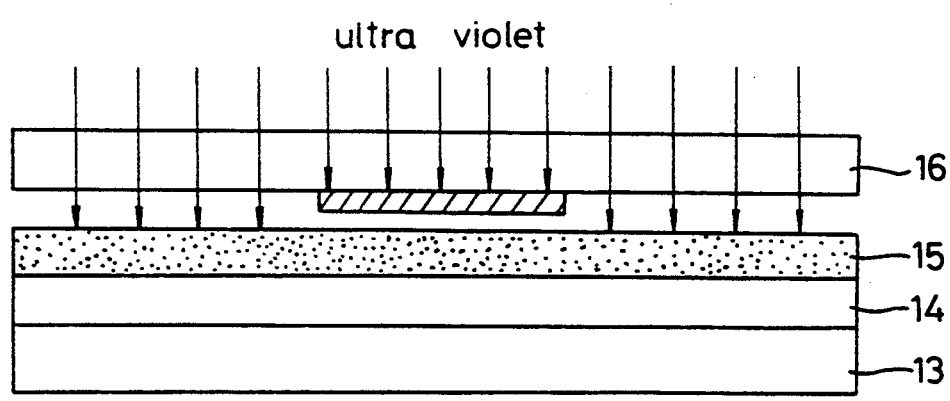
Figure 5E:
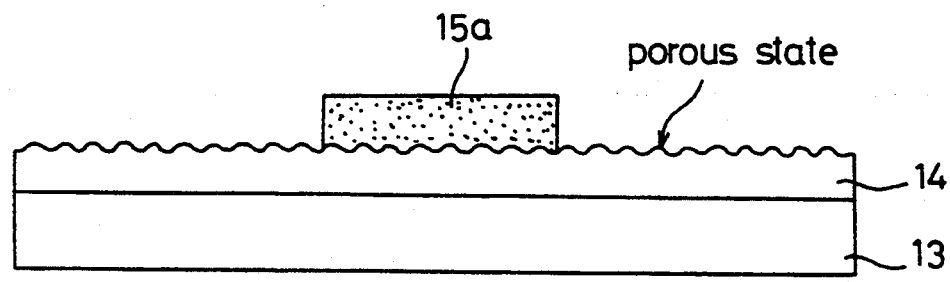

As shown in FIG. 5A, a pattern forming layer 14 is deposited on a substrate 13. The pattern forming layer 14 is dipped into a dipping solution which is prepared by mixing an etchant with a deionized water at a certain volume ratio (1:10 to 1:100), so that the surface of pattern forming layer 14 becomes porous, as shown in FIG. 5B. On the pattern forming layer 14, a photoresist 15 of a certain thickness is coated as shown in FIG. 5C, on which a photomask 16 printed with a predetermined pattern is coated as shown in FIG. 5D. The photomask 16 and the photoresist 15 are exposed to ultra violet radiation and the photoresist 15 is developed to form a photoresist pattern layer 15a, as shown in FIG. 5E. Thereafter, the pattern forming layer 14 is wet etched by using the etching solution, so as to form a pattern layer 14a. At this time, the etching velocity $V_S$ in the direction vertical to the surfaces of photoresist 15 and pattern forming layer 14 is rapid, since the surface of pattern forming layer 14 has the porous structure provided by the dipping, so that the formed pattern layer 14a can have a smooth slope at its edges. The slope angle is preferably about 15° to about 25° and depends on the concentration of the dipping solution, the dipping time, the pattern forming layer used, the etching solution used and the etching temperature. After the photoresist pattern layer 15a is removed, a desired pattern layer 14a is produced on the substrate 13, as shown in FIG. 5G.

As mentioned above, the process according to the present invention enables the forming of the pattern layer having a edge slope of about 15° to about 25°, thereby avoiding a poor step coverage and a short failure due to the breakdown occurring in using a pattern layer which has a edge slope of about 45° according to the conventional wet etching method. Accordingly, the productivity of semi-conductors is improved and their reliability is also improved.

The following are examples of application of the method of the invention for slope etching using the wet etching method. The precise values of the solutions used according to the method of the invention will be dependent upon the condition of the photoresist and the time of photo processing.

EXAMPLE 1

Where the pattern forming layer is chromium (Cr), a suitable dipping solution is a mixture of $Ce(NH_4)_2(NO_3)_2$, $HClO_4$ and water, present at a volume ratio of 1:1:10-100. According to the one embodiment of the invention, the etchant is a mixture of $Ce(NH_4)_2(NO_3)_6$, $HClO_4$ and water, provided at a weight ratio of 1:1:8.

EXAMPLE 2

Where the pattern forming layer is silicon nitride (SiN), a suitable dipping solution is a mixture of HF(48%) and water, present at a volume ratio of between 1:10 and 1:100. According to the one embodiment of the invention, the etchant is a mixture of HF(48%) and water, provided at a volume ratio of 1:50.

EXAMPLE 3

Where the pattern forming layer is silicon dioxide ($SiO_2$), a suitable dipping solution is a mixture of HF(48%) and water, present at a volume ratio of between 1:10 and 1:100. According to the one embodiment of the invention, the etchant is a mixture of HF(48%) and water, provided at a volume ratio of 1:50.

The precise values of the solution will be dependent upon the condition of the photoresist and the time of photo processing.

Now, the second embodiment of the present invention will be described, in conjunction with FIGS. 6A to 6D.

First, a pattern forming layer 18 to be etched is deposited on a substrate 17. On the pattern forming layer 18, a photoresist 19 is coated. At a position upwardly spaced apart from the photoresist 19 at a distance of 1 μm to 50 μm, a photomask 20 printed with a predetermined pattern is disposed in a proximity alignment manner. At this state, the photomask 20 and the photoresist 19 are developed by using ultra violet radiation so that the ultra violet radiation is scattered at the corner portions of the printed pattern on the photomask 20, thereby forming a photoresist pattern layer 19a having edges of a smooth slope, as shown in FIG. 6B. Subsequently, the RIE method is performed, as shown in FIG. 6C. At this time, the etching is carried out by using a mixture which contains an etching gas and $O_2$ gas mixed with said etching gas at a flow rate of about 2 to 50 SCCM. The etching gas used depends on the kind of pattern forming layer 18 to be etched. $O_2$ gas functions to etch the photoresist pattern layer 19a, so that the pattern forming layer 18 and the photoresist pattern layer 19a are etched simultaneously.

At this time, the flow rate of $O_2$ gas determines the etching velocity of the photoresist pattern layer 18a and thus the slope of the edges of the photoresist pattern layer 18a. Therefore, the flow rate of $O_2$ gas depends on the kind of pattern forming layer 18 and the kind and the thickness of photoresist 19.

Thus, the pattern forming layer 18 and the photoresist pattern layer 19a are etched simultaneously, as shown in FIG. 6C, thereby producing a pattern layer 17a having the edge slope of about 15° to 20°, as shown in FIG. 6D.

In this embodiment, the photomask 20 is disposed at the position which is upwardly spaced apart from the surface of sample coated with the photoresist 19 at a distance of 1 μm to 50 μm. Accordingly, as ultra violet radiation is radiated over the photomask 20, the photoresist pattern layer 19a having inclined edges is formed first. Then, the sample is etched by using the RIE method and the gas mixture which contains the etching gas and $O_2$ gas mixed with the etching gas at a flow rate of 2 to 50 SCCM, thereby causing the pattern layer 18a to have a smooth edge slope.

As apparent from the above description, the above process enables the slope etching of pattern forming layer using the RIE method, thereby avoiding poor step coverage and short failure which may occur at the corners of pattern layer after the process integration. As a result, the productivity of semi-conductors can be improved. In addition, the RIE method which has been used for anisotropic etching can be used for slope etching, thereby enabling the substitution of the wet etching process using chemical solutions by the dry etching process using the RIE method. Accordingly, it is possible to eliminate the complexity of the manufacturing process, to reduce the manufacturing time and cost and to improve productivity.

The following are examples of application of the method of the invention for slope etching using the dry (RIE) method. The precise values of the gas mixtures used according to the method of the invention will be dependent upon the condition of the photoresist and the time of photo processing.

EXAMPLE 1

Where the pattern forming layer is tantalum (Ta), a suitable etching gas is a mixture of carbon tetrafluoride and oxygen ($CF_4(O_2\ 8\%)$). According to the one embodiment of the invention, the etching gas has a flow rate of 20 SCCM (±5 SCCM) and the oxygen gas is provided at a flow rate of 2 to 10 SCCM.

EXAMPLE 2

Where the pattern forming layer is molybdenum tantalum (MoTa), a suitable etching gas is a mixture of carbon tetrafluoride and oxygen ($CF_4(O_2\ 8\%)$). According to the one embodiment of the invention, the etching gas has a flow rate of 20 SCCM (±5 SCCM) and the oxygen gas is provided at a flow rate of 2 to 8 SCCM.

EXAMPLE 3

Where the pattern forming layer is quartz-silicon (Q-si), a suitable etching gas is carbon dichloride difluoride ($CCl_2F_2$). According to the one embodiment of the invention, the etching gas has a flow rate of 18 SCCM and the oxygen gas is provided at a flow rate of 1 to 10 SCCM.

EXAMPLE 4

Where the pattern forming layer is silicon nitride (SiN), a suitable etching gas is carbon hydrogen trifluoride ($CHF_3$). According to the one embodiment of the invention, the etching gas has a flow rate of 10 SCCM and the oxygen gas is provided at a flow rate of 2 to 10 SCCM.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A slope etching process comprising the steps of:
    depositing a pattern forming layer on a substrate;
    preparing a non-oxidizing dipping solution for wet etching which contains a mixture of an etching solution and deionized water in a volume ratio of 1:10 to 1:100, the composition of the etching solution in the dipping solution being chosen from among etchants which are etchants for the particular pattern forming layer being used and which will form a desired porous surface on the pattern forming layer, without the formation of an oxide, after dipping the pattern forming layer in said dipping solution for a period of time, and dipping said pattern forming layer into said dipping solution for said time;
    coating a photoresist on the dipped pattern forming layer, aligning a photomask over the photoresist, and applying radiation and developing said photoresist to form a photoresist pattern layer; and
    wet etching the pattern forming layer by using the etching solution to obtain a pattern layer having a desired edge slope and removing said photoresist pattern layer.

* * * * *